United States Patent
Kim et al.

(10) Patent No.: US 8,004,844 B2
(45) Date of Patent: Aug. 23, 2011

(54) ENCLOSURE DEVICE OF WIRELESS COMMUNICATION APPARATUS

(75) Inventors: Duk-Yong Kim, Yongin-si (KR); Jung-Pil Lee, Hwaseong-si (KR); Kyoung-Seuk Kim, Suwon-si (KR); Chang-Woo Yoo, Suwon-si (KR); Sung-Ho Jang, Suwon-si (KR)

(73) Assignee: KMW, Inc., Youngchon-Ri, Tongtan-Nyon, Hwasong-Shi, Kyonggi-Do (KR)

( * ) Notice: Subject to any disclaimer, the term of this patent is extended or adjusted under 35 U.S.C. 154(b) by 168 days.

(21) Appl. No.: 12/402,593

(22) Filed: Mar. 12, 2009

(65) Prior Publication Data

US 2009/0231815 A1 Sep. 17, 2009

Related U.S. Application Data

(60) Provisional application No. 61/041,280, filed on Apr. 1, 2008.

(30) Foreign Application Priority Data

Mar. 12, 2008 (KR) .................. 10-2008-0023015
Apr. 1, 2008 (KR) .................. 10-2008-0030475

(51) Int. Cl.
*H05K 7/20* (2006.01)

(52) U.S. Cl. ........ 361/716; 361/714; 361/715; 361/728; 361/729; 361/730; 361/731

(58) Field of Classification Search .......... 361/714–716, 361/728–731
See application file for complete search history.

(56) References Cited

U.S. PATENT DOCUMENTS

| | | | | |
|---|---|---|---|---|
| 2,796,559 A | * | 6/1957 | Feucht ................... | 361/714 |
| 3,011,105 A | * | 11/1961 | Le Blanc ................ | 257/722 |
| 3,023,264 A | * | 2/1962 | Allison .................. | 174/395 |
| 3,163,207 A | * | 12/1964 | Schultz .................. | 165/68 |
| 4,507,701 A | * | 3/1985 | Fujiwara et al. ......... | 361/127 |
| 4,528,615 A | * | 7/1985 | Perry ..................... | 361/722 |
| 4,547,833 A | * | 10/1985 | Sharp .................... | 361/716 |
| 4,662,002 A | * | 4/1987 | Davis et al. ............. | 398/105 |
| 4,695,924 A | * | 9/1987 | Wozniczka .............. | 361/720 |
| 4,858,068 A | * | 8/1989 | Bitller et al. ........... | 361/679.01 |
| 4,888,637 A | * | 12/1989 | Sway-Tin et al. ........ | 174/252 |
| 5,309,315 A | * | 5/1994 | Naedel et al. ........... | 361/704 |
| 5,838,085 A | * | 11/1998 | Roesel et al. ........... | 310/113 |
| 5,896,268 A | * | 4/1999 | Beavers ................. | 361/690 |

(Continued)

FOREIGN PATENT DOCUMENTS

JP 03250793 A * 11/1991

(Continued)

*Primary Examiner* — Anatoly Vortman
(74) *Attorney, Agent, or Firm* — Cha & Reiter, LLC

(57) ABSTRACT

An enclosure device of a wireless communication apparatus, which has a tubular structure with increased heat dissipation not unknown heretofore. A section of the enclosure device has a polygonal or circular shape, such as a substantially cylindrical structure, and the enclosure, which has a plurality of radiation fins arranged on an outer surface of the enclosure in a vertical direction, is formed integrally with the radiation fins by using a compression method. Various communication devices of the wire communication apparatus are mounted on the interior of the enclosure. The structure is preferably formed by the radiation fins and exhibits an increased radiation effect than that of a structure where radiation fins are arranged side by side on a flat plane.

18 Claims, 11 Drawing Sheets

U.S. PATENT DOCUMENTS

| | | | | |
|---|---|---|---|---|
| 5,930,113 | A * | 7/1999 | McCann | 361/704 |
| 6,028,769 | A * | 2/2000 | Zurek | 361/704 |
| 6,046,908 | A * | 4/2000 | Feng | 361/707 |
| 6,053,841 | A * | 4/2000 | Koide et al. | 476/40 |
| 6,065,530 | A * | 5/2000 | Austin et al. | 165/80.3 |
| 6,118,662 | A * | 9/2000 | Hutchison et al. | 361/704 |
| 6,292,556 | B1 * | 9/2001 | Laetsch | 379/338 |
| 6,396,691 | B1 * | 5/2002 | Pagnozzi | 361/690 |
| 6,404,637 | B2 * | 6/2002 | Hutchison et al. | 361/704 |
| 6,507,494 | B1 * | 1/2003 | Hutchison et al. | 361/704 |
| 6,510,223 | B2 * | 1/2003 | Laetsch | 379/338 |
| 6,535,603 | B2 * | 3/2003 | Laetsch | 379/338 |
| 6,628,521 | B2 * | 9/2003 | Gustine et al. | 361/704 |
| 6,778,389 | B1 * | 8/2004 | Glovatsky et al. | 361/690 |
| 6,781,264 | B1 * | 8/2004 | Conrad et al. | 310/77 |
| 6,862,180 | B2 * | 3/2005 | Sawyer et al. | 361/690 |
| 6,865,085 | B1 * | 3/2005 | Ferris et al. | 361/721 |
| D530,683 | S * | 10/2006 | Rivas et al. | D13/179 |
| 7,180,736 | B2 * | 2/2007 | Glovatsky et al. | 361/688 |
| 7,450,382 | B1 * | 11/2008 | Fischer et al. | 361/695 |
| 7,535,716 | B2 * | 5/2009 | Fischer et al. | 361/714 |
| 7,610,947 | B2 * | 11/2009 | Wang et al. | 165/80.3 |
| 7,734,040 | B1 * | 6/2010 | Ayres et al. | 379/451 |
| 2002/0008962 | A1 * | 1/2002 | Hutchison et al. | 361/704 |
| 2003/0047304 | A1 * | 3/2003 | Kasuga | 165/185 |
| 2009/0133857 | A1 * | 5/2009 | Stegmaier | 165/104.33 |
| 2009/0317698 | A1 * | 12/2009 | Murata | 429/62 |

FOREIGN PATENT DOCUMENTS

WO    WO 2004105261 A1 * 12/2004

* cited by examiner

ENCLOSURE DEVICE OF WIRELESS COMMUNICATION APPARATUS

CLAIMS OF PRIORITY

This application claims priority from an application entitled "Enclosure Device of Wireless Communication Apparatus" filed in the Korean Intellectual Property Office on Mar. 12, 2008 and assigned Serial No. 10-2008-0023015 and on Apr. 1, 2008 and Serial No. 10-2008-0030475, the contents of which are hereby incorporated by reference in its entirety, and this application claims priority from U.S. provisional application 61/041,280, filed Apr. 1, 2008, the contents of which are hereby incorporated by reference in its entirety.

BACKGROUND OF THE INVENTION

1. Field of the Invention

The present invention relates to an enclosure of a wireless communication apparatus. More particularly, the present invention is related to an enclosure device of a wireless communication apparatus, which can have a small size and have a superior radiation effect.

2. Description of the Related Art

In general, as known in the art, various communication devices are mounted on an enclosure of a wireless communication apparatus. As such devices and/or components, for example, a high output amplifier, a radio frequency (RF) signal processing block, a high speed signal processing element, a power supplying device, a digital processing unit, etc., just to name a few, and which generate a large amount of heat, are mounted on the enclosure.

Due to the heat generated when the devices are operated under maximum load, the temperature of the air increases within the enclosure of the communication apparatus including the aforementioned devices. When the temperature of air within the enclosure increases beyond an optimal ambient temperature or operational range, each lifespan of the devices is reduced due to the heat. In addition, many operational functions/capabilities of the communication apparatus thereof are deteriorated due to the generated heat. In addition, the increased temperature influences the performance of other devices near the heat-generating devices, and is also the reason why an erroneous operation can be performed, or data processing can be impeded or impossible, in a case where the temperature of the air increases dramatically.

In addition, the devices have an airtight structure because of water-resistance, damp-resistance, dust-resistance, etc. Therefore, the increase of temperature of the interior of the enclosure fatally influences the devices, thereby causing erroneous operation and damages of the device. A technique for rapidly releasing the generated heat out of the enclosure has been required.

An enclosure device of a conventional communication device will be described with reference to FIGS. 1 to 3. As shown in FIG. 1, the conventional communication device 100 includes an enclosure 110 having a predetermined reception space, and electronic devices for communication, such as, for example, a high output amplifier, a power supplying device, etc., are mounted on the reception space within the enclosure 110.

As shown in FIG. 1, a cooling device 130 for cooling the increased temperature of the interior of the enclosure 100 is disposed at the rear surface of the disclosure 100. As this cooling device, there is a passive type cooling device having radiation plates 140 attached thereon and an active type cooling device, which compulsorily circulates air surrounding the radiation plate 140 by means of a fan. A proper cooling device among the cooling devices is selected according to each situation.

The enclosure device shown in FIGS. 1 to 3 includes a passive type cooling device and an active type cooling device. As shown, the enclosure device includes a radiation plate 140, which is installed on a rear surface of the enclosure 110 and has a plurality of radiation fins 145 (best seen FIGS. 2 and 3) integrally installed thereon, a blower fan 150 (FIG. 1) installed on a lower part of the enclosure 110 so as to force air toward the radiation plate 140, and a porous plate 160 (FIG. 2), which is installed at the rear surface of the enclosure 110 and has a plurality of through-holes 161 formed thereon so as to allow inner air to be discharged to the outside.

The conventional enclosure device shown in FIGS. 1-3 includes a radiation plate 140, which can cool generated heat in consideration of the amount of heat generated in the communication device, and an enclosure 110 corresponding to the size of the radiation plate 140. The enclosure 110 and the radiation plate 140 are assembled with each other. Communication electronic devices 115 (FIG. 1) are mounted on the interior of the enclosure 110, that is, a part of the enclosure corresponding to the radiation plate 140. A door 113 is installed on a front surface of the enclosure. The porous plate 160 (FIGS. 1 and 2) is attached onto the rear surface of the enclosure 110. A plurality of blower fans 150 is installed between the radiation plate 140 and the porous plate 160. Also, radiation heat prevention plates (not shown) are additionally installed on an outer circumferential surface of a lower body of the enclosure 110 in such a manner that they are spaced with a predetermined interval so as to prevent radiant heat.

In the conventional enclosure device of a wireless communication apparatus including but not limited to the example shown above, the area of one surface of a radiation plate has no choice but to increase because all heat generation devices are installed at in the one surface of the radiation plate. If the area of the radiation plate becomes larger, the enclosure has to be manufactured with a size corresponding to the increased area of the radiation plate. As a result, the size of the enclosure increases in accordance with the increase of the area of the radiation plate. In addition, the cooling efficiency is reduced because the heat generating devices have to be cooled through only the area of one surface of the radiation plate. Also, in general, in a case where an outdoor communication apparatus is required to be installed at a higher position above the ground, if the size of an enclosure if the apparatus increases, it is difficult to install the apparatus on that position. Also, the conventional enclosure includes two pieces, that is, a housing having a box-shape and a door, so that the enclosure has to be manufactured through only die casing, and it is difficult to manufacture the enclosure by using a compression method.

Also, there has been a recently tendency to more manufacture environment-friendly products than in the past. In a case of such products, such as an outdoor communication apparatus, etc., which is installed at a lower end of an antenna, etc., an enclosure shaped differently from an antenna radome is installed on the apparatus, there is a disadvantage in that the external appearance of the apparatus is not appealing.

SUMMARY OF THE INVENTION

Accordingly, the present invention provides an enclosure device of a wireless communication apparatus, which can have a small size.

Also, an exemplary aspect of the present invention provides an enclosure device of a wireless communication apparatus, having a small size and also secures a superior effect in radiating heat than known heretofore.

In addition, an exemplary aspect of the present invention provides an enclosure device of a wireless communication apparatus, which has an enclosure having a structure that is preferably tube-shaped and has a plurality of radiation fins formed on an outer circumferential surface of the enclosure, and a heat generation device attached onto an inner circumferential surface of the enclosure, so that a surface area in comparison with an inner surface in contact with the device can be maximized, and good effect in heat emission is secured.

Furthermore, an exemplary aspect of the present invention provides an enclosure device of a wireless communication apparatus, which allows a heat generation product to be directly attached onto an inner circumferential surface of the enclosure without additional members, thereby increasing the radiation efficiency.

Also, an exemplary aspect of the present invention provides an enclosure device of a wireless communication apparatus, which has a plurality of radiation fins radially arranged on an outer circumferential surface of a housing that is tube-shaped, wherein each interval between finishing ends of the radiation fins is larger than each interval between starting ends of the radiation fins so that radiation efficiency is superior in comparison with a case where radiation fins are arranged on a flat plane.

Also, an exemplary aspect of the present invention provides an enclosure device of a wireless communication apparatus, which has a housing manufactured through a compression method so that it is possible to secure superior radiation efficiency in comparison with a case where a conventional housing is manufactured through die costing.

In accordance with an exemplary aspect of the present invention, there is provided an enclosure of a wireless communication apparatus, which has a housing having a tube-shaped structure by using a compression method, and has a plurality of radiation fins formed on an outer circumferential surface of the housing.

Therefore, an enclosure structure of a wireless communication apparatus according to the present invention provides a relatively small size, secures superior radiation efficiency, and can be manufactured and assembled in an easy manner than known heretofore.

BRIEF DESCRIPTION OF THE DRAWINGS

The above and other exemplary aspects, features and advantages of the present invention will be more apparent from the following detailed description taken in conjunction with the accompanying drawings, in which.

DETAILED DESCRIPTION

Hereinafter, an exemplary embodiment according to the present invention will be described with reference to the accompanying drawings. In the description herein below, many particular items such as a detailed component device are shown, but these are given only for providing the general understanding of the present invention, it will be understood by those skilled in the art that such particular items can be modified and changed within the scope of the present invention. A person of ordinary skill in the art understands and appreciates that the exemplary enclosure device is provided for illustrative purposes and does not limit in any way the claimed invention to the exemplary description shown and described herein below.

Figure 4:
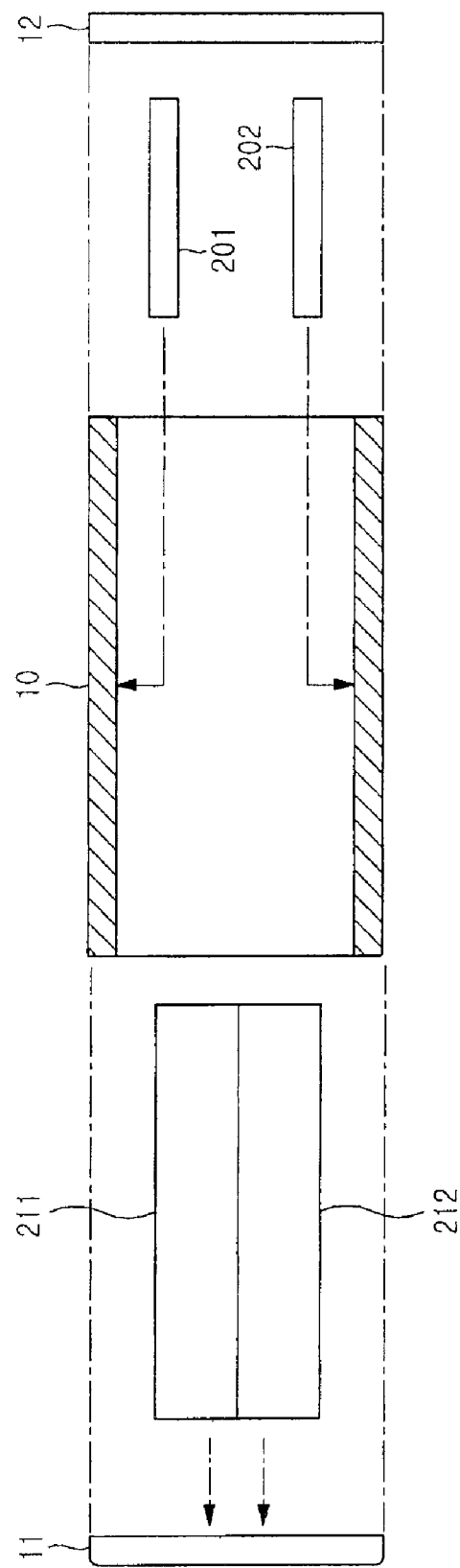
FIG. 4 is a side view showing the structure of an enclosure device of a wireless communication apparatus according to an exemplary embodiment of the present invention.
Figure 5:
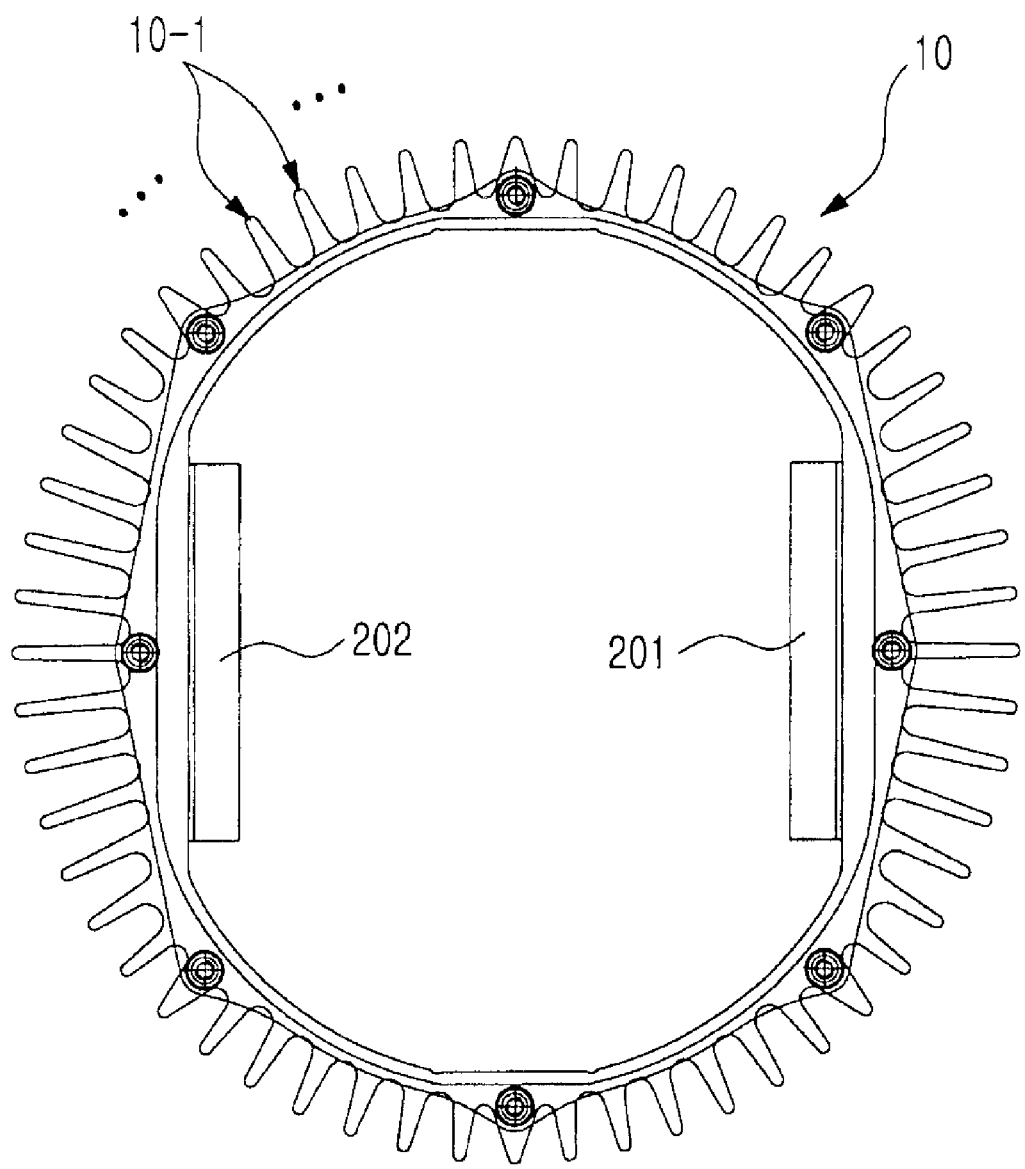
FIG. 5 is a plane view of an enclosure of FIG. 4.

FIG. 4 is a side view showing a structure of an enclosure device of a wireless communication apparatus according to an exemplary embodiment of the present invention, and FIG. 5 is a plane view of the enclosure of FIG. 4. Referring to FIGS. 4 and 5, an enclosure device of a wireless communication apparatus according to the present invention has a structure shaped like a tube, which may comprise, for example, a cross section of a polygonal shape, an ellipse-shape, or a circular shape, etc., e.g. a cylindrical-type structure. Also, the enclosure device has a plurality of radiation fins 10-1 arranged on an outer circumferential surface thereof in a vertical direction. Fins 10-1 are manufactured integrally with the enclosure device preferably through a compression method, and enclosure 10 has various communication devices of a corresponding wireless communication apparatus mounted on the interior of the enclosure.

Also, the closure device includes an upper cap 12 for covering an open upper part of the enclosure 10 and a lower cap 11 for covering a lower open part of the enclosure 10. The lower cap 11 and the upper cap 12 are assembled with the enclosure 10, for example by using attachment products, including but in now way limited to screws, etc., and may be attached by being press fit, latched, etc. just to name a few possibilities. At this time, signal input elements for communication devices positioned within the enclosure 10 can be disposed at the lower cap 11 and/or the upper cap 12.

In the exemplary enclosure device according to the present invention, which has the above-mentioned structure, the enclosure 10 has a structure preferably formed by bending a conventional radiation plate, which has a plate-shape and has a plurality of radiation fins in such a manner that both ends of the plate are connected with each other. Also, various communication devices are disposed in an inner space of the enclosure. Therefore, it can be understood that in an exemplary embodiment of the invention, the radiation plate, itself, can form the enclosure.

Accordingly, in comparison with known conventional enclosures having a radiation plate attached thereon, the above-mentioned enclosure increases radiation efficiency remarkably. Also, an enclosure having a shape formed integrally with the radiation plate according to the present invention can be manufactured through a processing method, which is easier and more rapidly performed than in comparison with a conventional and typical die casting. Also, the enclosure can be manufactured, for example, through the compression method so that the enclosure has efficiency in delivering heat, which is two times greater than an enclosure manufactured through die casting, thereby securing superior radiation efficiency.

Figure 1:
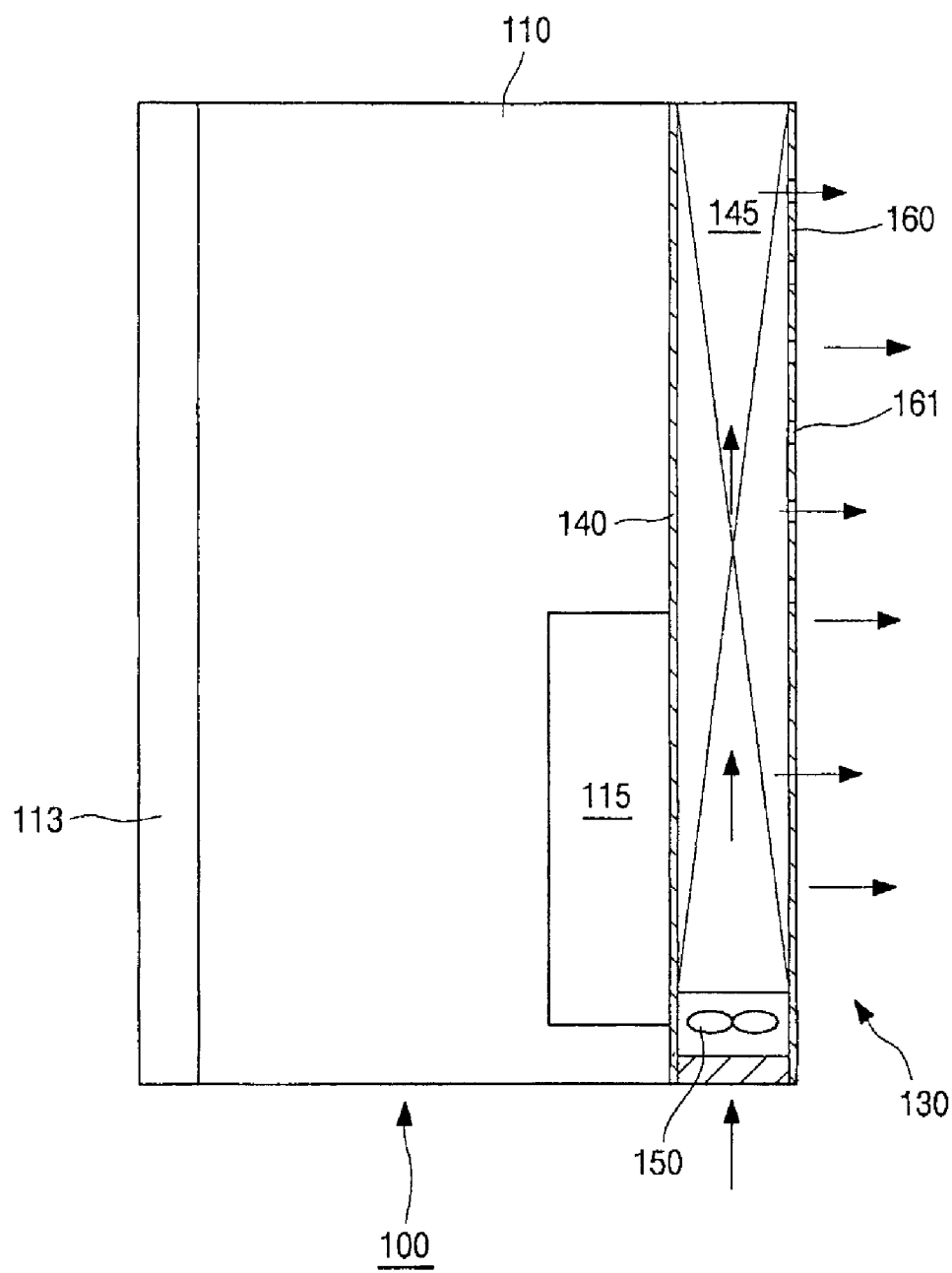
FIG. 1 is a sectional view of a conventional enclosure device of a wireless communication apparatus.
Figure 2:
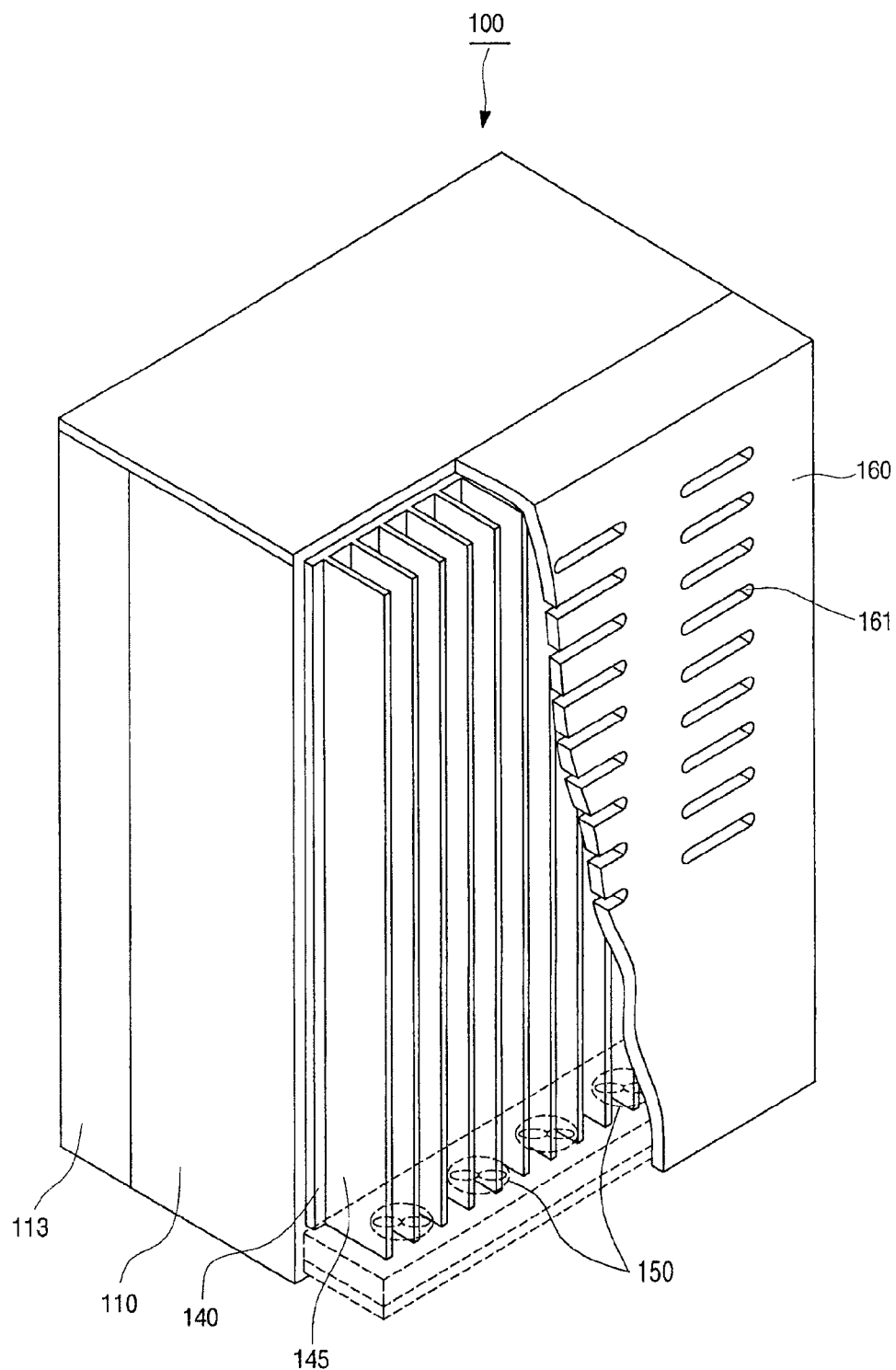
FIG. 2 is a partially cut-off perspective view of a conventional enclosure device of a wireless communication apparatus.
Figure 3:
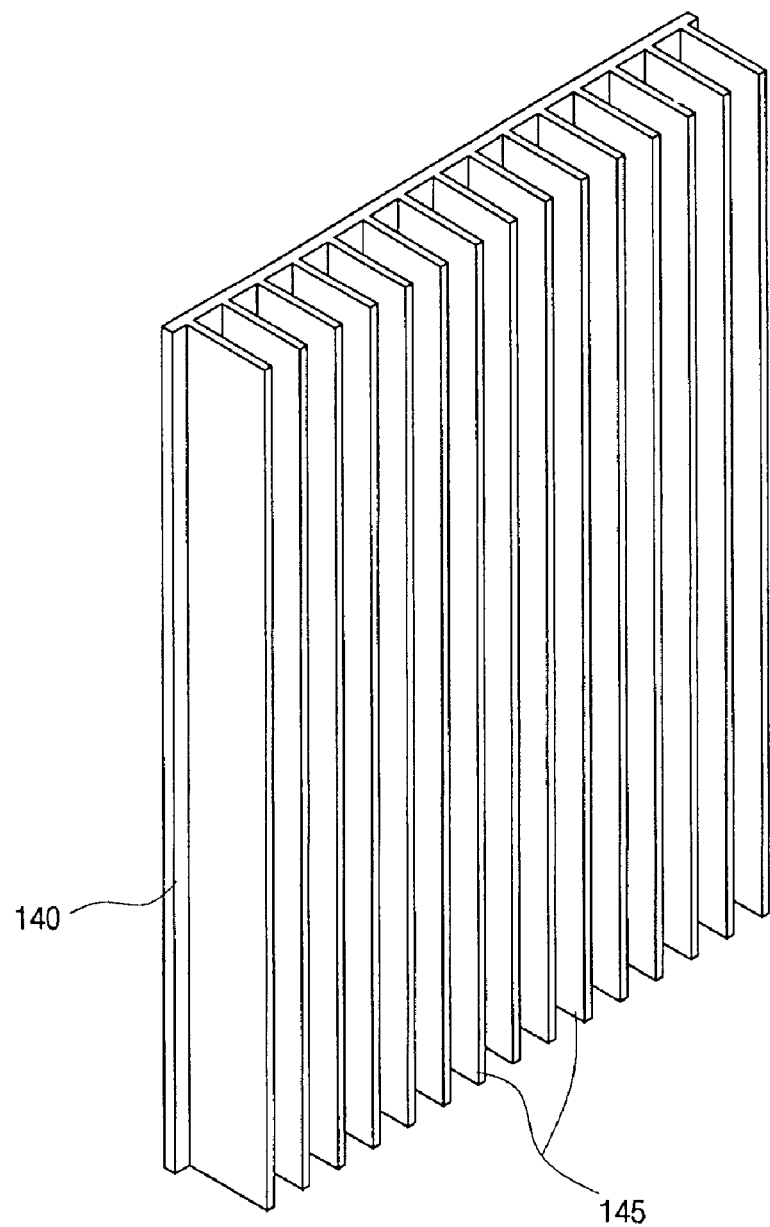
FIG. 3 is a perspective view of a conventional radiation plate.

Although, in the enclosure according to the present invention, which is manufactured as described above, the various communication devices can be installed within the enclosure 10 through a typical screw assembly (including but in no way limited to pins, nuts, nails, bolts) and/or a connection by laser welding, adhesives, epoxy, press fitting, latches, interlocking snaps, protrusions/protuberances and recesses, etc., according to an exemplary embodiment of the present invention, in order to increase radiation efficiency, a device in large amount of generated heat (hereinafter, referred to as a heat generation device, and referential numerals 201 and 202 of FIGS. 3 and 4), such as a high output amplifier among the communication devices, is mounted on a mount position within the enclosure 10 in such a manner that the device is directly soldered thereon. Through such a structure, heat generated from the heat generation devices 201 and 202 is directly delivered to the enclosure 10 so that much higher radiation efficiency can be secured. At this time, although the heat-generating device has its own housing, it may comprise, for example, a printed circuit board (PCB), itself, on which various chips, other electrical components, and electronic components are mounted. A method for soldering such heat-generating devices 201 and 202 will be described below in detail.

First, solder cream is printed on each mount surface of the heat generation devices 201 and 202. At this time, particularly, in a case where an amplifying element, etc., which is required to emit heat, among the heat-generating devices 201 and 202, the element may be directly soldered on the interior of the enclosure 10 through a through-hole previously formed on the PCB without the need for the body of the element to pass through the PCB.

The heat-generating devices 201 and 202 having solder cream printed thereon is moved to a mount portion within the enclosure 10 through a jig (not shown) having a proper structure and is seated thereon. Then, the heat generation devices undergo a process of melting and hardening the solder cream. For example, the process of melting and hardening the solder cream may be performed to each heat generating device (201 and 202). After seating a heat-generating device (201 or 202) on a corresponding mount portion, the corresponding portion of the enclosure 10 is heated with a predetermined and proper temperature through a heating device, such as a hot plate. In addition, such a process of melting and hardening solder cream may be performed in a high temperature heat furnace having a structure similar to that of a high temperature heat furnace used in typical reflow soldering.

In such a process of melting and hardening solder cream, in order to allow solder cream between corresponding heat generation devices 201 and 202 and the enclosure 10 to make close contact with the devices, it is possible to press a proper portion on the heat-generating devices 201 and 202, particularly, the surroundings of the components in a large amount of generated heat by using a jig with a proper shape. This is because the radiation efficiency is reduced if solder cream doesn't make contact with the devices and an air layer is formed between the heat generation devices 201 and 202 and the interior of the enclosure 10. Also, a post-process, such as a plating process, which is suitable for directly soldering the heat-generating devices 201 and 202, may be previously performed to each mount surface of the heat generation devices 201 and 202 within the enclosure 10. Also, an anodizing process may be performed beforehand to the entire outer surface of the enclosure 10 so that the processed surface functions coating material, which can emit heat and protect the enclosure against outer environment.

Meanwhile, as shown in FIG. 5, in the above described structure, the inner surface of the enclosure 10, on which the heat generating devices 201 and 202 are seated, is formed preferably with a flat-shape so as to make close contact with each soldering surface of the heat generation devices 201 and 202. Also, in order to secure superior radiation efficiency of each portion of the enclosure, on which the heat-generating devices 201 and 202 are installed, the sectional shape of the enclosure, which is formed by sections of radiation fins 10-1, is substantially circular in shape. However, radiation fins 10-1 positioned at a part of the enclosure, of which the heat generation devices 210 and 202 are installed at an inner surface, and has a length longer than that of radiation fins 10-1 positioned at another part of the enclosure.

Also, if considering the distance between the radiation fins 10-1, it can be understood that the radiation fins 10-1 are radially arranged on an outer circumferential surface of the enclosure 10 with a cylindrical shape so that the enclosure has a structure where each interval between starting ends of the radiation fins is larger than each interval between finishing ends of the radiation fins. Such a structure formed by the radiation fins has a better radiation effect than that of a structure where radiation fins are arranged side by side on the flat plane.

After the heat-generating devices 201 and 202 are mounted on the interior of the enclosure 10 by soldering, other communication devices, such as a high frequency filter (having a comparatively small amount of generated heat), are then preferably mounted on the interior of the enclosure. Such communication devices may be mounted on the lower cap 11 or the upper cap 12. FIG. 4 shows an example of other communication devices (designated by numerals 211 and 212) being mounted on the lower cap 11. When the lower cap 11 and the enclosure 10 are assembled with each other after corresponding devices are mounted on the lower cap 11, the devices 211 and 212 mounted on the lower cap 11 is inserted into the enclosure 10 through sliding. Of course, in order to prevent the heat generating devices 201 and 202 previously soldered on the interior of the enclosure 10 and the devices 211 and 212 mounted on the lower cap 11 from bumping against each other, the devices have each structure designed to prevent physical interference there between. At this time, the communication devices 211 and 212 are mounted on the lower cap 11. Therefore, when the communication devices 211 and 212 are assembled with the lower cap, it is possible to assemble the communication devices in various directions (up, down, front, and rear directions). Therefore, they can be easily assembled in comparison with a case where various communication devices are assembled within a conventional enclosure shaped like a box.

Figure 6:
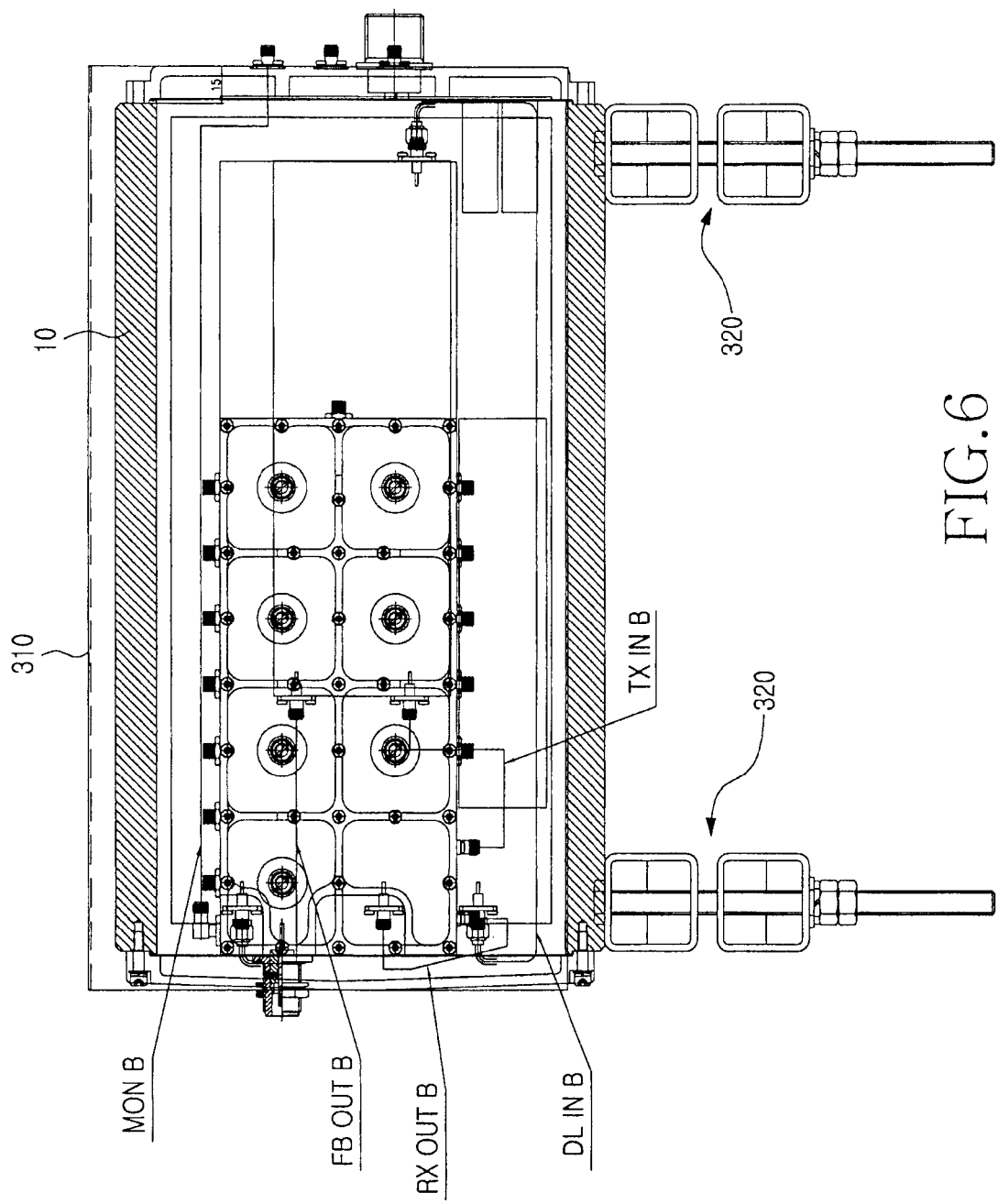
FIG. 6 is a side view of a wireless communication apparatus employing an enclosure device according to an exemplary embodiment of the present invention.
Figure 7:
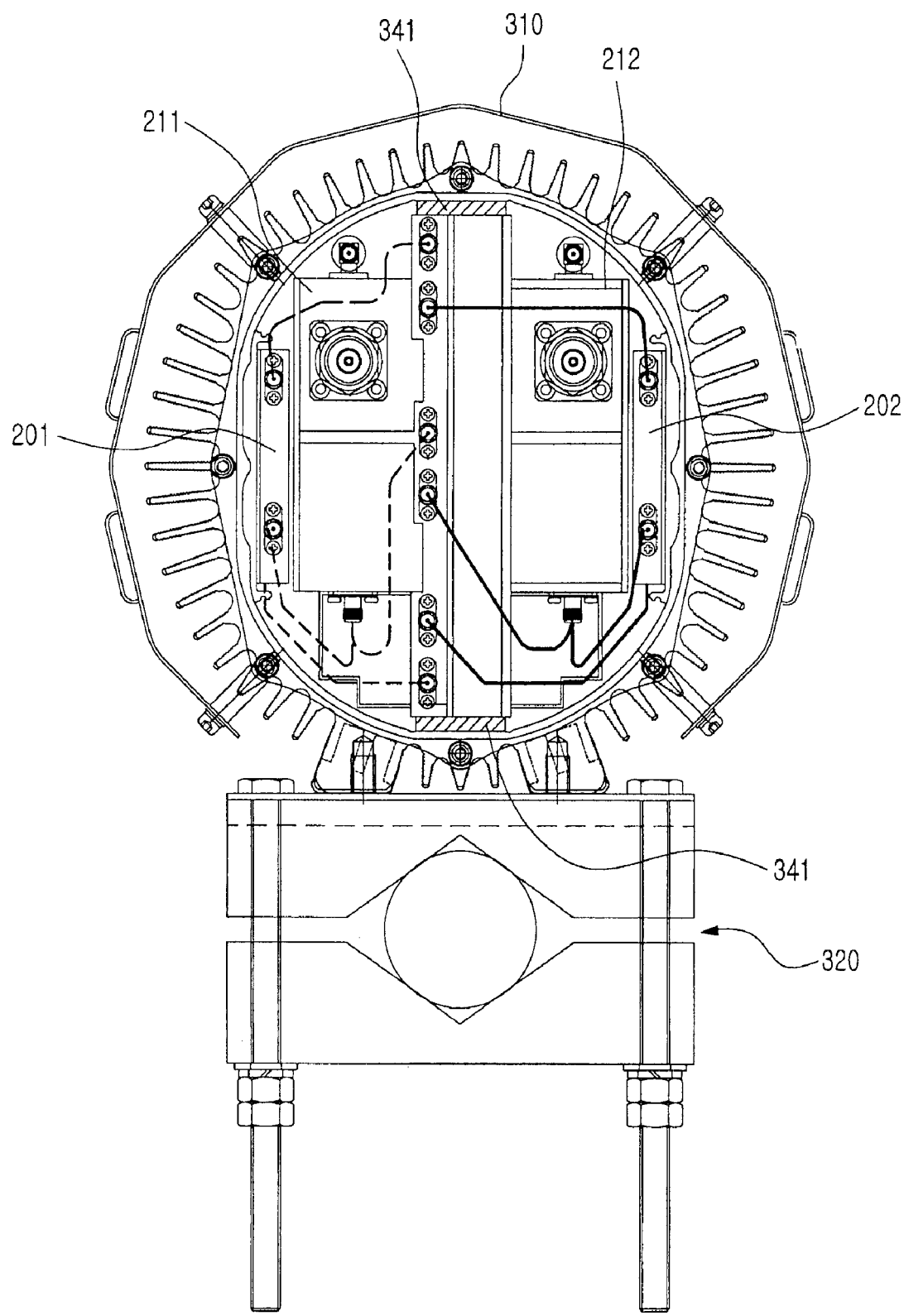
FIG. 7 is a plane view showing a lower part of the wireless communication apparatus of FIG. 6.
Figure 8:
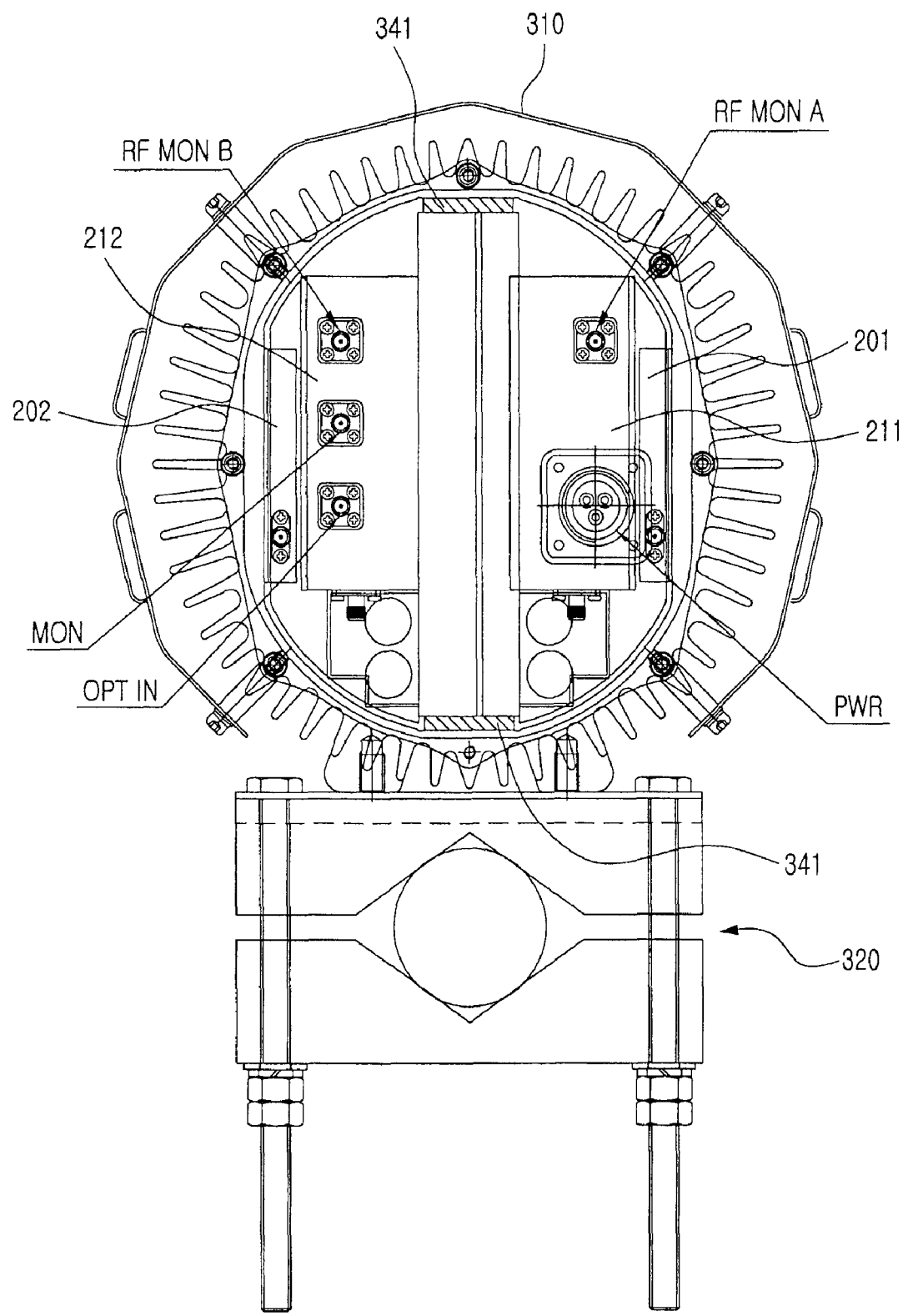
FIG. 8 is a plane view showing an upper part of the wireless communication apparatus of FIG. 6.
Figure 9:
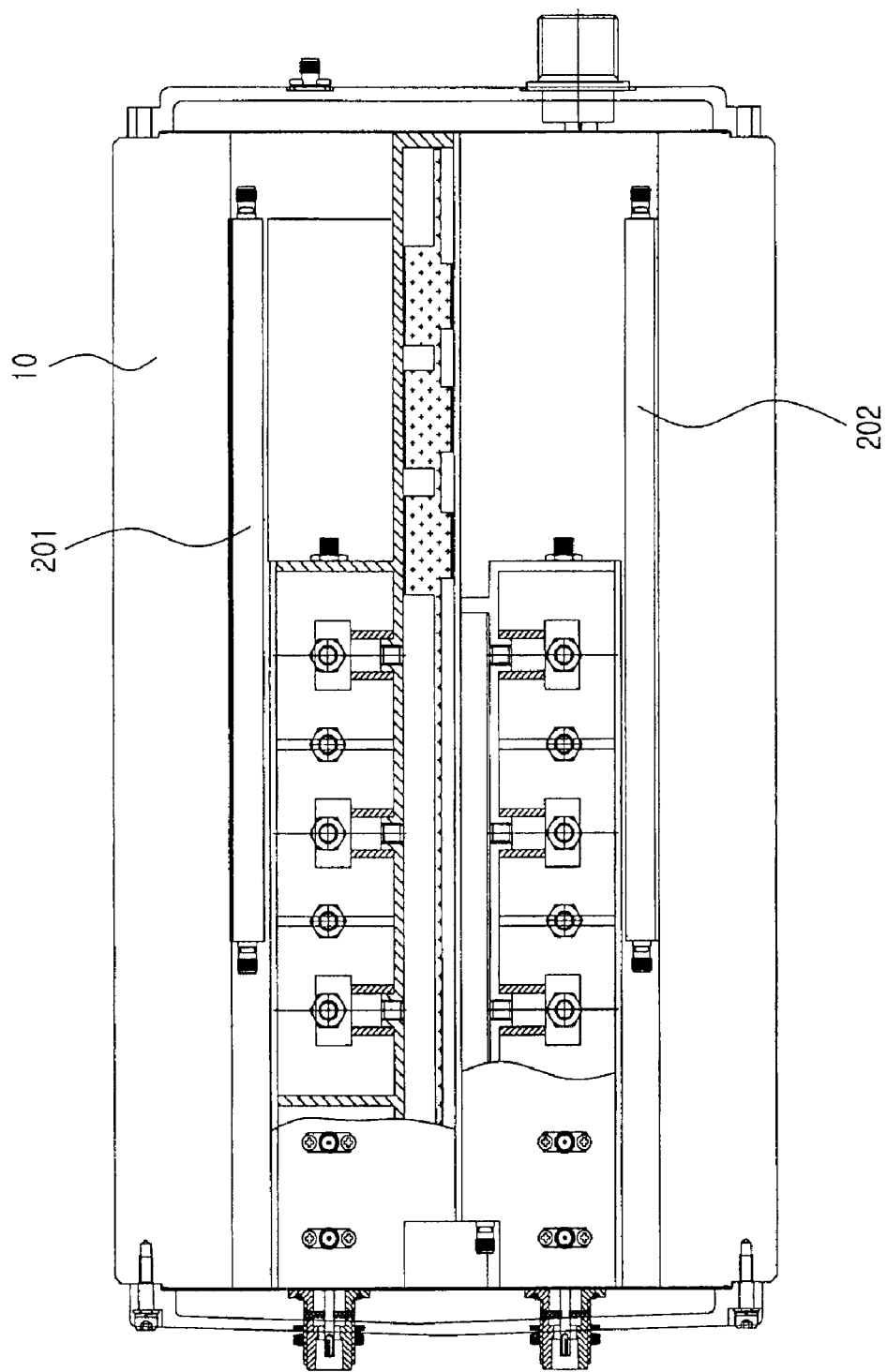
FIG. 9 is another side view of a wireless communication apparatus of FIG. 6.
Figure 10:
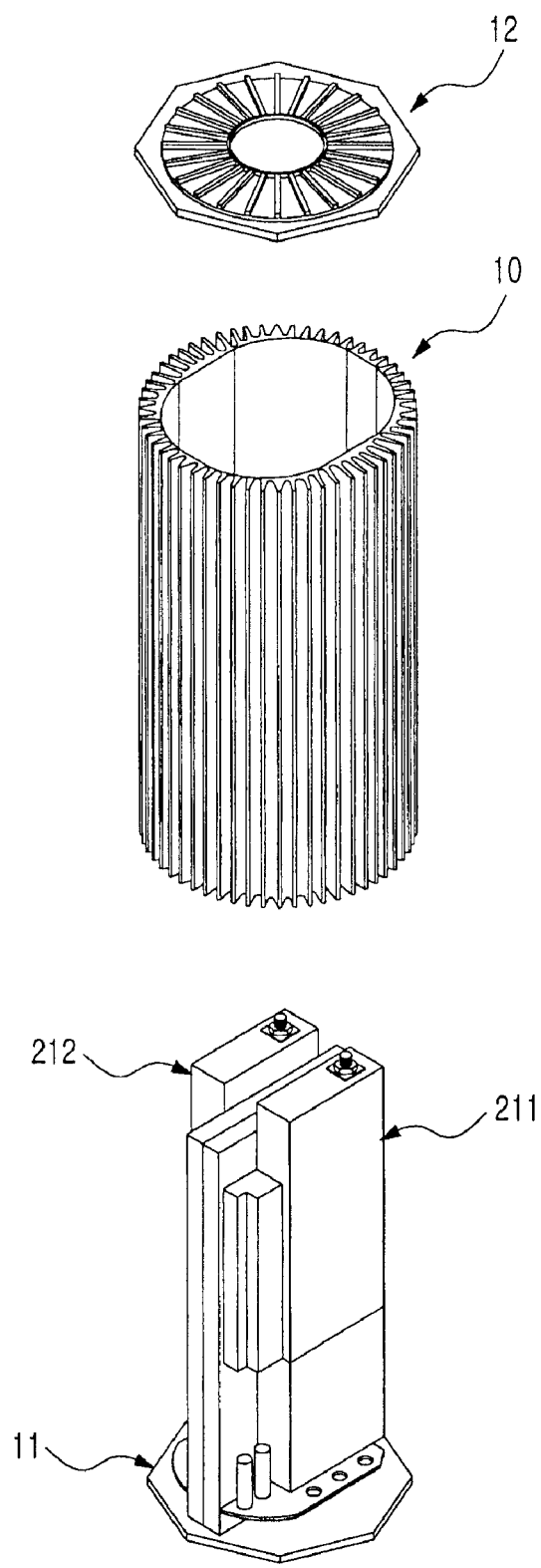
FIG. 10 is a perspective view showing a state where an enclosure, an upper cap, a lower cap, other communication devices of FIG. 6 are assembled with each other.

FIG. 6 is a side view of a wireless communication apparatus employing an enclosure device according to an exemplary embodiment of the present invention, FIG. 7 is a plane view showing a lower part of the wireless communication apparatus of FIG. 6, and FIG. 8 is a plane view showing an upper part of the wireless communication apparatus of FIG. 6. Also, FIG. 9 is another side view of the wireless communication apparatus of FIG. 6, and FIG. 10 is a perspective view showing a state where an enclosure, an upper cap, a lower cap, other communication devices are assembled with each other of FIG. 6. It is understood that reference numerals, which are equal to reference numerals of FIGS. 4 and 5, among reference numerals of FIGS. 6 to 10, designate the same component. Referring to FIGS. 6 to 10, the enclosure according an exemplary aspect of the present invention may be mounted on a column for installation of a base station antenna through a bracket structure 320. Also, in this case, a radiant heat prevention plate 310 for preventing the radiation of solar heat may be additionally installed on an outer part of the enclosure apparatus.

Now referring to FIGS. 7 and 8, when other communication devices 211, 212, etc. are mounted on the interior of the enclosure 10, a thermal-pad 341, which has a proper structure for achieving further superior efficiency in delivering heat and supporting a corresponding device, may be additionally installed between the communication devices and the enclosure 10.

Figure 11:
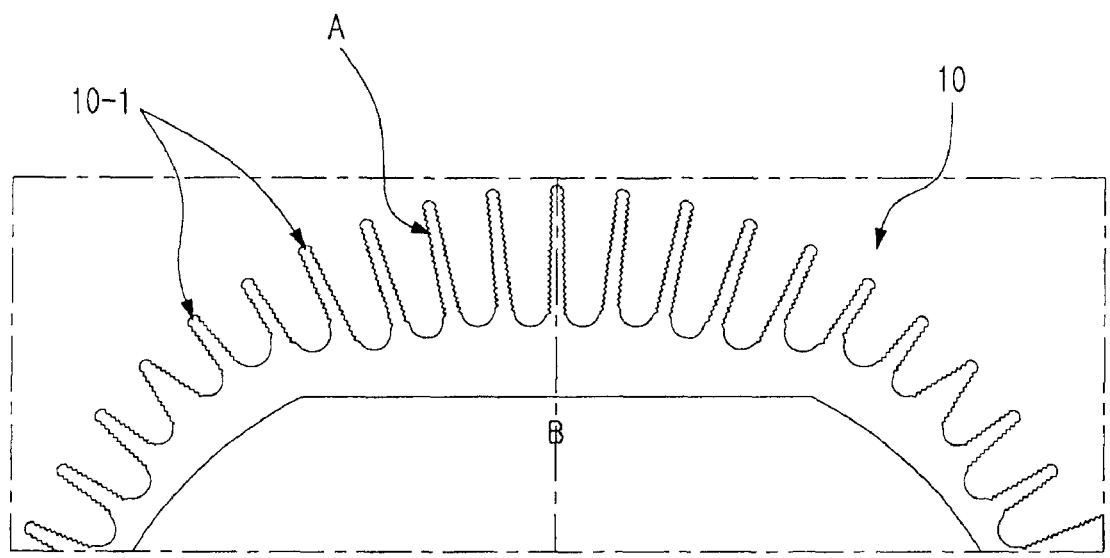
FIG. 11 is a view showing an enlarged part of the enclosure of FIG. 5.

FIG. 11 is a partial view showing an enlarged part of the enclosure of FIG. 5. Each structure of the enclosure 10 and the radiation fins 10-1 will now be described in more detail. First, if considering the thickness of the enclosure 10, based on the center of a surface (designated as A in FIG. 11) making contact with the heat generation device, the thickness of the center of the enclosure 10 is the largest, and the thickness of the enclosure becomes thicker toward the periphery part thereof. Also, it can be understood that the length of a radiation fin 10-1 of a central portion in contact with the heat-generating device is longest, and each length of the radiation fin 10-1 becomes shorter toward the periphery area of the enclosure. Also, each radiation fin 10-1 may have serrations B (see FIG. 11) formed on the outer surface thereof so that radiation area can be maximized due to this serrations.

As such, the enclosure device of a wireless communication apparatus according to an exemplary embodiment of the present invention can be structured as described above. Although an exemplary embodiment according to the present invention has been described in detail, it is possible for an artisan to implement modified embodiments within the spirit of the present invention and the scope of the appended claims.

For example, the structure where two heat-generating devices 201 and 202 are installed on the interior of the enclosure 10 has been described above. In addition, of course, it is natural that a structure where more than two devices are installed within the enclosure is possible.

Also, when the enclosure device according to the present invention is actually installed, a structure where a separate cooling fan is disposed on the outer part of the enclosure is possible. In this case, a cylindrical structure for surrounding the enclosure device is assembled with the enclosure device, and a cooling fan can be installed on the lower side of the cylindrical structure.

Also, although, in the above description, the entire enclosure 10 is formed by performing a compression process once, after dividing the enclosure into two longitudinal parts based on a transverse direction, the enclosure can be formed by performing a compression process, for example twice such that the compression process is performed once to each part. In this case, an additional process for assembling the two half parts with each other by fasteners and or fastening/adjoining agents of types beyond the use of screws, etc. For example, a process for soldering a heat generating device on each half of the enclosure can be easily performed. It will be understood by those skilled in the art that various changes in form and details may be made therein without departing from the spirit and scope of the invention as defined by the appended claims. Accordingly, the scope of the invention is not to be limited by the above exemplary embodiment but by the claims and the equivalents thereof.

What is claimed is:

1. A enclosure device of a wireless communication apparatus, the enclosure device comprising:
an enclosure having a substantially tube-shaped structure with open upper and lower parts, the enclosure having a plurality of radiation fins arranged on an outer circumferential surface of the tube-shaped structure and an interior surface of said tube-shaped structure having at least one substantially flat region wherein a thickness between an outer surface of the tube-shaped structure and each of the at least one substantially flat regions is greater than a thickness between the outer surface of the tube-shaped structure and regions of the interior surface other than each of the at least one substantially flat regions;
an upper cap for covering the open upper part of the enclosure; and
a lower cap for covering the open lower part of the enclosure.

2. The enclosure device according to claim 1, wherein the radiation fins are arranged circumferentially along a longitudinal axis of the tube-shaped structure.

3. The enclosure device of a wireless communication apparatus as claimed in claim 1, further comprising mounting positions on at least one of the substantially flat regions of the interior surface of the enclosure, wherein, at least one of: electric and electronic communication devices are mounted at corresponding ones of the mounting positions.

4. The enclosure device of a wireless communication apparatus as claimed in claim 3, further comprising mounting positions on at least one of the upper cap and the lower cap, said mounting positions suitable for attaching at least one of: electrical and electronic components to a corresponding one of the upper cap and the lower cap, the mounting positions on the at least one of the upper cap and the lower cap being arranged to attach the at least one electrical and electronic components to the at least one upper cap and lower cap so that the attached at least one electrical or electronic component is positioned within the enclosure when the at least one upper cap and the lower cap is attached to the enclosure.

5. The enclosure device of a wireless communication apparatus as claimed in claim 4, wherein a thermal-pad is disposed on a preset portion between the at least one electrical and electronic component attached to the at least one upper cap and lower cap and the interior surface of the enclosure.

6. The enclosure device of a wireless communication apparatus as claimed in claim 4, wherein the radiation fins are formed on the outer surface of the enclosure corresponding to each of the substantially flat regions of the interior surface have a length that is longer than a length of radiation fins formed on another part of the outer surface of the enclosure.

7. The enclosure device of a wireless communication apparatus as claimed in claim 1, wherein the enclosure and the plurality of radiation fins, are integrally formed.

8. The enclosure device of a wireless communication apparatus as claimed in claim 1, wherein one or more of the plurality of radiation fins include serrations formed on a respective outer surface of the radiation fins.

9. The enclosure device of a wireless communication apparatus as claimed in claim 1 wherein the tube-shaped structure of the enclosure is formed integrally with the plurality of radiation fins by compression molding.

10. The enclosure device of a wireless communication apparatus as claimed in claim 1, wherein the tube-shaped structure of the enclosure is formed by compression molding after first dividing the tube-shaped structure into two half parts along a longitudinal axis of the tube-shaped structure, performing the compression method, once to each half part.

11. A wireless communication apparatus comprising an enclosure device, the enclosure device comprising:
  a substantially tube-shaped structure having an open upper part and a lower part; and
  a plurality of radiation fins radially arranged on an outer circumferential surface of the tube-shaped structure, wherein an interior surface of said tube-shaped structure has at least one substantially flat region and a thickness between an outer surface of the tube-shaped structure and each of the at least one substantially flat regions is greater than a thickness between the outer surface of the tube-shaped structure and regions of the interior surface other than each of the at least one substantially flat regions, the substantially flat regions including mounting points on which at least one of: electric and electronic devices of the wireless communication apparatus is mounted;
  an upper cap for covering the open upper part of the enclosure;
  a lower cap for covering the open lower part of the enclosure;
  wherein the at least one of the electric and electronic devices mounted to the substantially flat regions of the interior surface are devices generating a large amount of heat.

12. The wireless communication apparatus as claimed in claim 11, further comprising:
  mounting positions on at least one of the upper cap and the lower cap, said mounting positions suitable for attaching at least one of: electrical and electronic component to a corresponding one of the upper cap and the lower cap, wherein the attached at least one electrical or electronic component is positioned within the enclosure when the at least one upper cap and the lower cap is attached to the enclosure.

13. The wireless communication apparatus as claimed in claim 12, wherein a thermal-pad disposed on a preset portion between the at least one electrical or electronic component and the interior surface of the enclosure.

14. The wireless communication apparatus as claimed in claim 12, wherein the radiation fins formed on the outer surface of the enclosure corresponding to each of the substantially flat regions of the interior surface have a length that is longer than a length of radiation fins formed on another part of the outer surface of the enclosure.

15. The wireless communication device as claimed in claim 11, wherein the tube-shaped structure is cylindrically-shaped.

16. The wireless communication device as claimed in claim 11, wherein at least one of the plurality of radiation fins have serrations formed on each outer surface of the radiation fins.

17. The wireless communication apparatus as claimed in claim 11, wherein the tube-shaped structure is formed integrally with the plurality of radiation fins by a compression method.

18. The wireless communication apparatus as claimed in claim 11, wherein the tube-shaped structure is formed integrally with the plurality of radiation fins by a compression method after dividing the tube-shaped structure into two half parts along a longitudinal axis of the tube-shaped structure, and the compression method is performed once to each half part.

* * * * *